(12) United States Patent
Takada et al.

(10) Patent No.: US 12,431,829 B2
(45) Date of Patent: Sep. 30, 2025

(54) POWER CONVERSION DEVICE

(71) Applicants: SANDEN CORPORATION, Isesaki (JP); KYUSHU INSTITUTE OF TECHNOLOGY, Kitakyushu (JP)

(72) Inventors: Kohei Takada, Isesaki (JP); Koji Kobayashi, Isesaki (JP); Tohlu Matsushima, Kitakyushu (JP)

(73) Assignees: SANDEN CORPORATION, Isesaki (JP); KYUSHU INSTITUTE OF TECHNOLOGY, Kitakyushu (JP)

( * ) Notice: Subject to any disclaimer, the term of this patent is extended or adjusted under 35 U.S.C. 154(b) by 133 days.

(21) Appl. No.: 18/035,012

(22) PCT Filed: Nov. 17, 2021

(86) PCT No.: PCT/JP2021/042240
§ 371 (c)(1),
(2) Date: May 2, 2023

(87) PCT Pub. No.: WO2022/107809
PCT Pub. Date: May 27, 2022

(65) Prior Publication Data
US 2024/0014758 A1     Jan. 11, 2024

(30) Foreign Application Priority Data
Nov. 19, 2020    (JP) ................................ 2020-192123

(51) Int. Cl.
*H02P 23/04*      (2006.01)
*H02M 7/539*      (2006.01)
(Continued)

(52) U.S. Cl.
CPC ............ *H02P 23/04* (2013.01); *H02M 7/539* (2013.01); *H02P 27/06* (2013.01); *H03H 7/0115* (2013.01)

(58) Field of Classification Search
CPC .......... H02M 7/539; H02M 1/44; H02M 1/14; H02P 27/06; H03H 7/0115
See application file for complete search history.

(56) References Cited

U.S. PATENT DOCUMENTS 5,517,063 A * 5/1996 Schantz, Jr. .............. B60L 3/00
                                                363/71
5,852,558 A * 12/1998 Julian ...................... H02M 1/12
                                                363/41
(Continued)

FOREIGN PATENT DOCUMENTS

| JP | 2009-273272 A | 11/2009 |
|---|---|---|
| JP | 5091521 B2 | 12/2012 |

(Continued)

OTHER PUBLICATIONS

Japan Patent Office; International Search Report issued in International Patent Application No. PCT/JP2021/042240, mailed Jan. 25, 2022.

(Continued)

*Primary Examiner* — Rina I Duda
(74) *Attorney, Agent, or Firm* — Baker Botts L.L.P.

(57) ABSTRACT

A power conversion device is provided which is capable of balancing impedance relatively easily and suppressing noise caused by a common mode current when a three-phase AC output is applied to drive a motor. When the inductance of a positive electrode-side path 16 is Zv, the inductance of a negative electrode-side path 17 is Zg, the capacitance between a positive electrode-side parasitic capacitance generation point P and a housing 15 is Zt, and the capacitance between a negative electrode-side parasitic capacitance generation point N and the housing 15 is Zb, the capacitance Zt and the capacitance Zb are set based on an equilibrium condition of a bridge circuit constituted by the inductance Zv, the inductance Zg, the capacitance Zt, and the capaci- (Continued)

tance Zb, An intermediate added impedance Zm1 is connected to output paths 32U to 32W between an intermediate path connecting low potential-side terminals of upper arm switching elements 3 to 5 and high potential-side terminals of lower arm switching elements 6 to 8 and a motor M.

18 Claims, 6 Drawing Sheets

(51) Int. Cl.
*H02P 27/06* (2006.01)
*H03H 7/01* (2006.01)

(56) References Cited

U.S. PATENT DOCUMENTS

| | | | |
|---|---|---|---|
| 6,342,793 B1* | 1/2002 | Lukes | H03K 19/017563 |
| | | | 327/287 |
| 6,926,288 B2* | 8/2005 | Bender | H03H 7/0115 |
| | | | 310/23 |
| 7,787,270 B2* | 8/2010 | NadimpalliRaju | H02M 7/217 |
| | | | 363/68 |
| 9,000,601 B2* | 4/2015 | Azuma | H01L 25/072 |
| | | | 257/784 |
| 9,209,176 B2* | 12/2015 | Wu | H01L 27/0629 |
| 9,374,021 B2* | 6/2016 | Tallam | G01R 19/0007 |
| 9,819,338 B2* | 11/2017 | Otake | H03K 17/162 |
| 2016/0240470 A1* | 8/2016 | Wu | H10D 30/4755 |

FOREIGN PATENT DOCUMENTS

| | | |
|---|---|---|
| JP | 2017-163709 A | 9/2017 |
| JP | 2019-221061 A | 12/2019 |
| JP | 2020-167787 A | 10/2020 |

OTHER PUBLICATIONS

Tohlu Matsushima et al., "Relation Between Parasitic Coupling Around Power MOSFET and Excitation of Common-Mode Voltage", The Institute of Electronics, Information and Communication Engineers, IEICE Technical Report, EMCJ2017-61, vol. 117, No. 317, pp. 13-18, Nov. 14, 2017, with English language Abstract, 6 pages.

* cited by examiner

POWER CONVERSION DEVICE

CROSS-REFERENCE TO RELATED APPLICATIONS

This application is a U.S. National Stage Patent Application under 37 U.S.C. § 371 of International Patent Application No. PCT/JP2021/042240, filed Nov. 17, 2021, which claims the benefit of Japanese Patent Application No. JP 2020-192123, filed Nov. 19, 2020, the disclosures of each of which are incorporated herein by reference in their entirety.

TECHNICAL FIELD

The present invention relates to a power conversion device which applies a three-phase AC output to a motor.

BACKGROUND ART

In a power conversion device which generates a three-phase AC output from a DC power supply by switching of switching elements and applies it to a motor, a common mode current (noise) which flows out to a housing (reference potential conductor) through a parasitic capacitance (parasitic coupling) between the motor and the housing increases due to sharp voltage fluctuations due to a switching operation. Therefore, there has heretofore been taken a measure of mounting a large EMI filter consisting of a common mode coil and a Y capacitor (common mode capacitor) on a power supply input unit of a control board, and flowing back the common mode current (noise) which flows out to the housing via the parasitic capacitance to the switching element (noise source) to reduce the noise (refer to, for example, Patent Document 1).

However, in such a noise measure, it is undeniable that noise countermeasure parts are increased in size, and the product itself including the control board becomes larger. Therefore, there has also been developed a measure of using a bridge circuit to balance the peripheral impedance with respect to the switching element which is the noise source, and reducing a potential difference between a noise outflow source and a noise measurement point, thereby resulting in reduced common mode current (noise) (refer to, for example, Patent Document 2 and Non-Patent Document 1).

CITATION LIST

Patent Documents

Patent Document 1: Japanese Patent No. 5091521
Patent Document 2: Japanese Patent Application Laid-Open No. 2019-221061

Non-Patent Document

Non-Patent Document 1: "Relation Between Parasitic Coupling Around Power MOSFET and Excitation of Common-Mode Voltage", IEICE Technical Report EMCJ2017-61 (2017-11)

SUMMARY OF THE INVENTION

Problems to be Solved by the Invention

However, in the measure of Patent Document 2, a problem arises in that when the inductance or capacitance added for balancing is switched by a switch, new noise is generated due to the surge, and further, control becomes complicated due to execution of the switching. In addition, Patent Document 2 does not consider a parasitic capacitance between the winding of a motor and a housing, which is one of noise outflow routes.

Further, there has been proposed in Non-Patent Document 1, an impedance balance method in a DC-DC converter. In this case, it is assumed that the parasitic capacitance between the arm midpoint of the switching element and the housing is small, and the intermediate impedance is sufficiently large. A problem however arises in that when balancing the impedance using the bridge circuit, the parasitic capacitance between the arm midpoint and the housing is large and the intermediate impedance is small in the case of a three-phase motor, so that it becomes difficult to balance and the effect is limited.

The present invention has been made to solve the above-mentioned conventional technical problems and aims to provide a power conversion device capable of even when a three-phase AC output is applied to drive a motor, relatively easily achieving impedance balance and effectively suppressing noise due to a common mode current.

Means for Solving the Problems

There is provided a power conversion device of the present invention which has an upper arm switching element and a lower arm switching element of each phase and applies a three-phase AC output to a motor. The power conversion device includes a positive electrode-side path to connect a positive electrode side of a DC power supply and a high potential-side terminal of the upper arm switching element, a negative electrode-side path to connect a negative electrode side of the DC power supply and a low potential-side terminal of the lower arm switching element, and an intermediate path to connect a low potential-side terminal of the upper arm switching element and a high potential-side terminal of the lower arm switching element. The power conversion device is characterized in that when the inductance of the positive electrode-side path is $Zv$, the inductance of the negative electrode-side path is $Zg$, the capacitance between a positive electrode-side parasitic capacitance generation point P and a reference potential conductor is $Zt$, and the capacitance between a negative electrode-side parasitic capacitance generation point N and the reference potential conductor is $Zb$, the capacitance $Zt$ between the positive electrode-side parasitic capacitance generation point P and the reference potential conductor and the capacitance $Zb$ between the negative electrode-side parasitic capacitance generation point N and the reference potential conductor are set based on an equilibrium condition of a bridge circuit constituted by the inductance $Zv$ of the positive electrode-side path, the inductance $Zg$ of the negative electrode-side path, the capacitance $Zt$ between the positive electrode-side parasitic capacitance generation point P and the reference potential conductor, and the capacitance $Zb$ between the negative electrode-side parasitic capacitance generation point N and the reference potential conductor, and an intermediate added impedance $Zm1$ is connected between the intermediate path and the motor.

The power conversion device of an embodiment of the invention is characterized in that in the above invention, the relationship of $Zg \cdot Zt = Zb \cdot Zv$ is established, or the relationship of $Zg \cdot Zt = Zb \cdot Zv$ is substantially established.

The power conversion device of an embodiment of the invention is characterized in the above respective inventions by including either one or both of a positive electrode-side added capacitance connected between the positive electrode-side parasitic capacitance generation point P and the reference potential conductor and a negative electrode-side added capacitance connected between the negative electrode-side parasitic capacitance generation point N and the reference potential conductor.

The power conversion device of an embodiment of the invention is characterized in that in the above respective inventions, the intermediate added impedance Zm1 is comprised of any of a normal mode coil, a three-phase common mode coil, and a ferrite core, or a combination of two of them, or all of them.

The power conversion device of an embodiment of the invention is characterized in the above respective inventions by including a control board to control switching of the upper and lower arm switching elements, and a wiring member provided to wire among the DC power supply, the control board, the upper and lower arm switching elements, and the motor, and in that the intermediate added impedance Zm1 is arranged in the wiring member.

The power conversion device of an embodiment of the invention is characterized in the above invention by including either one or both of a positive electrode-side added capacitance connected between the positive electrode-side parasitic capacitance generation point P and the reference potential conductor and a negative electrode-side added capacitance connected between the negative electrode-side parasitic capacitance generation point N and the reference potential conductor, and in that the positive electrode-side added capacitance and/or the negative electrode-side added capacitance is arranged in the wiring member.

The power conversion device of an embodiment of the invention is characterized in that in another embodiment of the invention, the wiring member is a bus bar assembly formed by molding a bus bar with a resin.

The power conversion device of an embodiment of the invention is characterized in the above respective inventions by including an EMI filter connected between the DC power supply and the upper and lower arm switching elements, and in that the EMI filter includes normal mode coils connected to both the positive electrode-side path and the negative electrode-side path respectively.

Advantageous Effect of the Invention

The present invention is a power conversion device which has an upper arm switching element and a lower arm switching element of each phase and applies a three-phase AC output to a motor. In the power conversion device including a positive electrode-side path to connect a positive electrode side of a DC power supply and a high potential-side terminal of the upper arm switching element, a negative electrode-side path to connect a negative electrode side of the DC power supply and a low potential-side terminal of the lower arm switching element, and an intermediate path to connect a low potential-side terminal of the upper arm switching element and a high potential-side terminal of the lower arm switching element, an intermediate added impedance Zm1 is further connected between the intermediate path and the motor. Therefore, it is possible to increase the impedance of a path passing through a parasitic capacitance between the motor and a reference potential conductor and reduce a common mode current which flows out from this path, thereby making it possible to suppress noise.

In particular, the intermediate added impedance Zm1 is connected between the intermediate path and the motor to sufficiently increase the impedance of the path passing through the parasitic capacitance between the motor and the reference potential conductor. Therefore, when the inductance of the positive electrode-side path is Zv, the inductance of the negative electrode-side path is Zg, the capacitance between a positive electrode-side parasitic capacitance generation point P and the reference potential conductor is Zt, and the capacitance between a negative electrode-side parasitic capacitance generation point N and the reference potential conductor is Zb, the capacitance Zt between the positive electrode-side parasitic capacitance generation point P and the reference potential conductor and the capacitance Zb between the negative electrode-side parasitic capacitance generation point N and the reference potential conductor are set based on an equilibrium condition of a bridge circuit constituted by the inductance Zv of the positive electrode-side path, the inductance Zg of the negative electrode-side path the capacitance Zt between the positive electrode side parasitic capacitance generation point P and the reference potential conductor, and the capacitance Zb between the negative electrode-side parasitic capacitance generation point N and the reference potential conductor, whereby when taking impedance balance (equilibrium), the values involving the intermediate impedance can be made small enough to be ignored, and the balance can be easily achieved to thereby make it possible to effectively reduce noise.

In this case, when the three-phase AC output is applied to the motor by having the upper arm switching element and the lower arm switching element of each phase, the parasitic capacitance between the arm midpoint and the reference potential conductor is large, and the intermediate impedance is small, so that it becomes difficult to achieve the balance. It becomes, however, possible to effectively solve such a problem by connecting the intermediate added impedance as in the present invention.

The equilibrium condition in the above is that as in an embodiment of the invention, the relationship of $Zg \cdot Zt = Zb \cdot Zv$ is established, or the relationship of $Zg \cdot Zt = Zb \cdot Zv$ is substantially established.

Also, as in an embodiment of the invention, if a positive electrode-side added capacitance is connected between the positive electrode-side parasitic capacitance generation point P and the reference potential conductor and/or a negative electrode-side added capacitance is connected between the negative electrode-side parasitic capacitance generation point N and the reference potential conductor, it becomes easier to balance the impedance.

Further, as in an embodiment of the invention, the intermediate added impedance Zm1 is preferably constituted by any of a normal mode coil, a three-phase common mode coil, and a ferrite core, or a combination of two of them, or all of them. Providing the three-phase common mode coil and the ferrite core as the intermediate added impedance makes it possible to increase a common mode impedance and reduce the outflow of a common mode current. On the other hand, due to the provision of the normal mode coil as the intermediate added impedance, it is possible to effectively suppress a switching surge. As a result, since the mode conversion between three-phase lines (from the normal mode to the common mode) is suppressed, these make it possible to be less susceptible to the parasitic capacitance between the motor and the reference potential conductor.

Moreover, unlike the common mode coil, the normal mode coil does not require the coupling of the three-phase lines, so that it can be arranged separately. There are fewer restrictions on the arrangement, and it is easier to be miniaturized than in the case of the common mode coil. Further, since a noise reduction effect can be obtained even if it is not included in all three phases (for example, only two phases), there is an advantage that it is easy to use.

In addition, as in an embodiment of the invention, when a control board to control switching of the upper and lower arm switching elements, and a wiring member provided to wire among the DC power supply, the control board, the upper and lower arm switching elements, and the motor are provided, it becomes also possible to miniaturize the device by arranging the intermediate added impedance Zm1 in the wiring member.

In this case, further, if a positive electrode-side added capacitance and a negative electrode-side added capacitance are also arranged in the wiring member as in an embodiment of the invention, further miniaturization of the device can be achieved.

Further, since the wiring member is constituted of a bus bar assembly made by molding a bus bar with a resin as in an embodiment of the invention, seismic resistance can also be secured while ensuring insulation.

In addition, as in an embodiment of the invention, an EMI filter connected between the DC power supply and the upper and lower arm switching elements is provided with normal mode coils connected to both the positive electrode-side path and the negative electrode-side path, respectively. With this provision, it is possible to suppress the inconvenience that a normal mode current flows out to the reference potential conductor as a common mode current.

In particular, by connecting the normal mode coil to both the positive electrode-side path and the negative electrode-side path, the impedances on the positive electrode side and the negative electrode side can be made equal, and the degree of equilibrium can be maintained, thereby making it possible to bring out the effect of impedance balance maximally.

MODE FOR CARRYING OUT THE INVENTION

Figure 1:
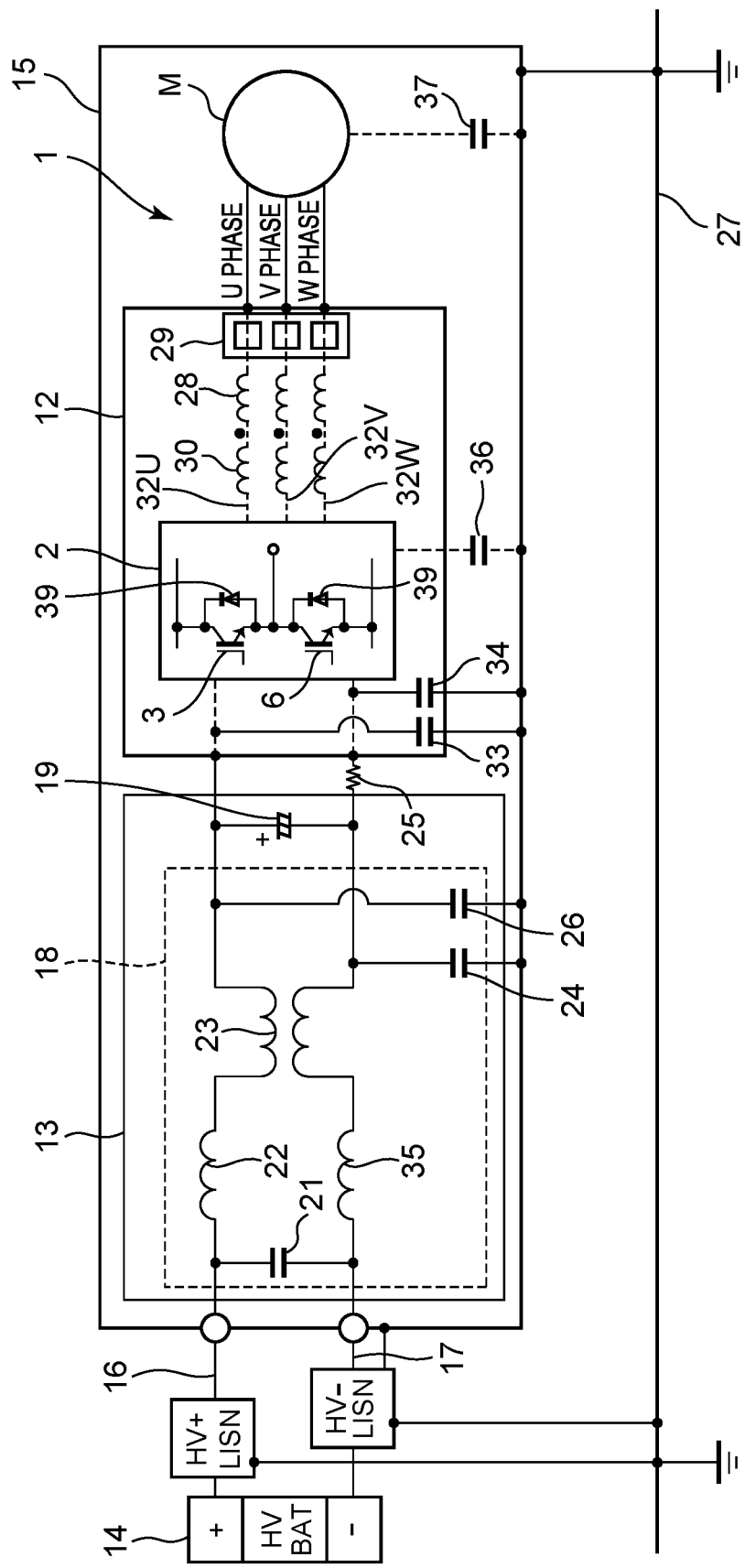
FIG. 1 is an electric circuit diagram of a power conversion device to which the present invention is applied.
Figure 2:
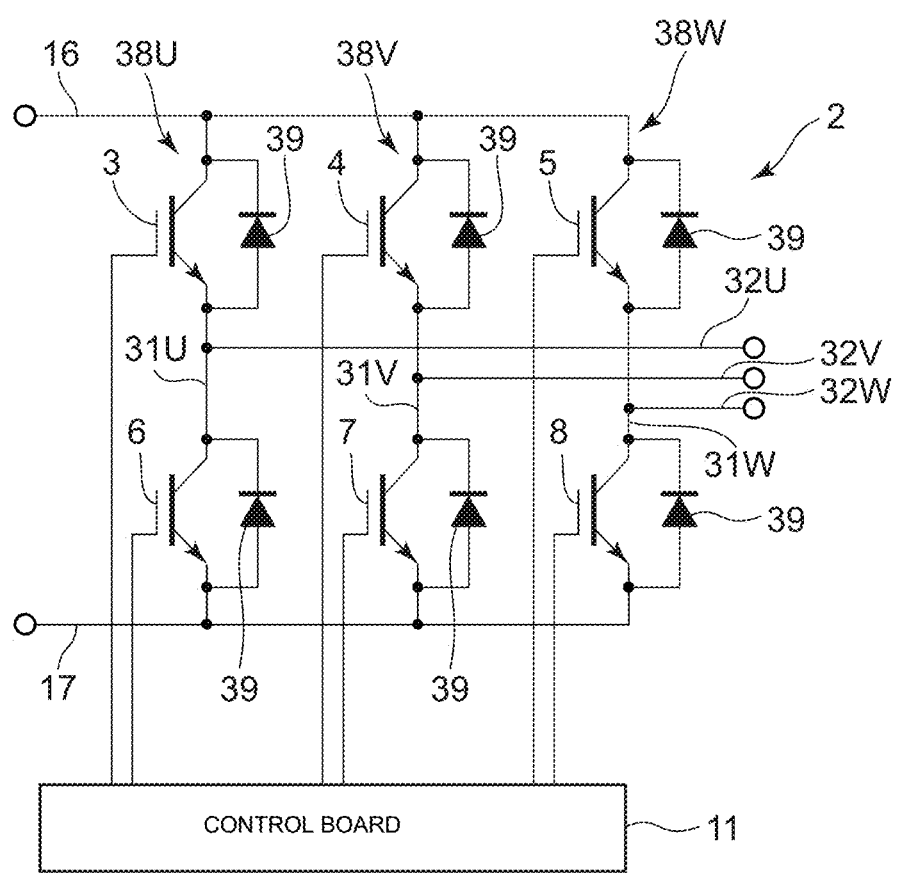
FIG. 2 is an electric circuit diagram of an inverter circuit and a control board of the power conversion device of FIG. 1.

Hereinafter, an embodiment of the present invention will be described in detail based on the drawings. FIG. 1 is an electric circuit diagram of a power conversion device 1 according to one embodiment to which the present invention is applied, and FIG. 2 is an electric circuit diagram of an inverter circuit 2 and a control board 11.

(1) Power Conversion Device 1

The power conversion device 1 according to the embodiment includes six switching elements 3 to 8 (FIG. 2) comprised of IGBTs (may be MOSFETs) constituting upper and lower arms of each phase of a three-phase inverter circuit 2, a control board 11 (FIG. 2) in which a control circuit is implemented in printed wiring, a bus bar assembly 12 as a wiring member for wiring among a battery 14, the control board 11, each switching element 3 to 8, and a motor M to be described later, and a filter board 13. The power conversion device 1 converts DC power supplied from the battery 14 of a vehicle as a DC power supply into three-phase AC power and supplies the same to a stator coil (not illustrated) of the motor M.

The motor M in the embodiment is comprised of an IPMSM (Interior Permanent Magnet Synchronous Motor), and drives an unillustrated compression mechanism housed in a metal (for example, aluminum)-made housing 15 of an unillustrated electric compressor mounted on a vehicle to compress a refrigerant and discharges it into a refrigerant circuit of an unillustrated vehicle air conditioning device. Then, it is assumed that the power conversion device 1 is integrally provided in the housing 15 of the electric compressor.

(2) Electric Circuit of Power Conversion Device 1

First, the electric circuit of the power conversion device 1 of the embodiment will be described with reference to FIG. 1. Reference numeral 16 is a positive elctrode-side path connected to the positive electrode side (+) of the battery 14 via an LISN (Line Impedance Stabilization Network). Reference numeral 17 is a negative electrode-side path connected to the negative electrode side (−) of the battery 14 via an LISN. An EMI filter 18 and a smoothing capacitor 19 are connected to the positive elctrode-side path 16 and the negative electrode-side path 17. These EMI filter 18 and smoothing capacitor 19 are connected between the battery 14 and the switching elements 3 to 8 of the inverter circuit 2.

The EMI filter 18 is comprised of an X capacitor 21 connected between the positive electrode-side path 16 and the negative electrode-side path 17, normal mode coils 22 and 35 respectively connected to both the positive electrode-side path 16 and the negative electrode-side path 17 at a post-stage of the X capacitor 21, a common mode coil 23 connected to a post-stage of these normal mode coils 22 and 35, and a Y capacitor 26 and a Y capacitor 24 respectively connected between the positive electrode-side path 16 and the negative electrode-side path 17 and the housing 15 at a post-stage of the common mode coil 23.

Then, these EMI filter 18 and smoothing capacitor 19 are arranged on the filter board 13. The X capacitor 21 is a capacitor for reducing normal mode noise, and the Y capacitors 24 and 26 are capacitors for reducing common mode noise. Further, the smoothing capacitor 19 is a capacitor for smoothing voltage ripples and considering a high frequency as a short circuit as a starting point for impedance balance.

Incidentally, the housing 15 is connected to a vehicle body 27 (GND). Then, in the embodiment, the housing 15 serves as a reference potential conductor of the power conversion device 1. Further, reference numeral 25 is a shunt resistor connected to the negative electrode-side path 17 between the bus bar assembly 12 and the smoothing capacitor 19.

(2-1) Intermediate Added Impedance Zm1 (Normal Mode Coil 30, Three-Phase Common Mode Coil 28 and Ferrite Core 29)

Further, the inverter circuit 2 is connected to the positive electrode-side path 16 and the negative electrode-side path 17 at a post-stage of the smoothing capacitor 19. The normal mode coil 30, the three-phase common mode coil 28, and the ferrite core 29 which constitute the intermediate added impedance Zm1 in the present invention are sequentially connected between intermediate paths 31U to 31W to be described later of the inverter circuit 2 and the motor M. These normal mode coil 30 and three-phase common mode coil 28 mainly increases the impedance of a low frequency, and the ferrite core 29 increases the impedance ref a high frequency. The ferrite core 29 is arranged around output paths 32U to 32W to be described later, but in the present invention, such an arrangement is also referred to as a connection. Further, it is assumed that the normal mode coil 30 is connected to all of the output paths 32U to 32W in the embodiment.

(2-2) Positive Electrode-Side Added Capacitance (Capacitor 33) and Negative Electrode-Side Added Capacitance (Capacitor 34)

Figure 3:
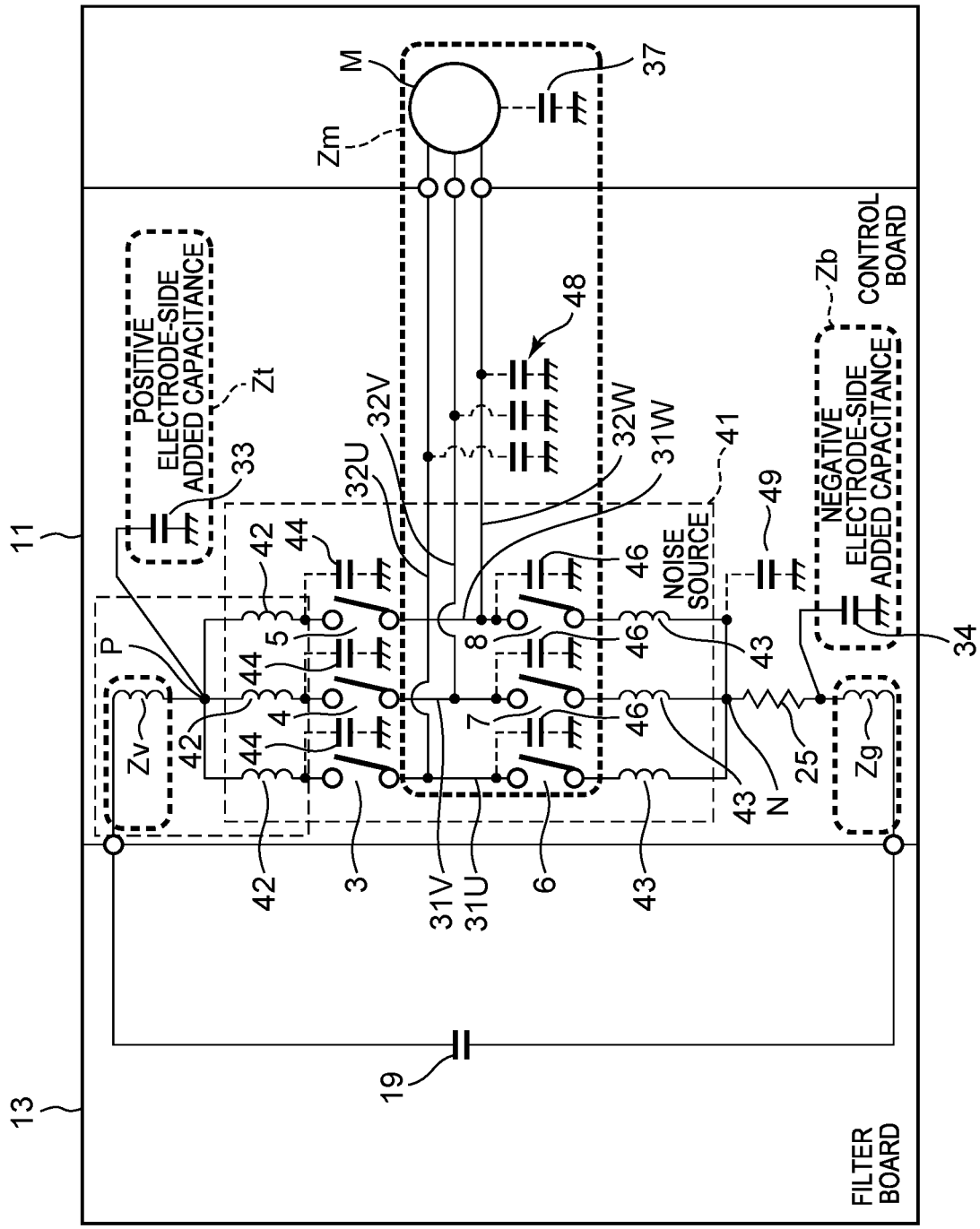
FIG. 3 is a diagram describing parasitic components of the control board (including a bus bar assembly) of the power conversion device of FIG. 1.

Further, a capacitor 33 (for impedance balance) as a positive electrode-side added capacitance constituting a capacitance Zt between a positive electrode-side parasitic capacitance generation point P and the housing 15 in the embodiment is connected between the positive electrode-side path 16 between the inverter circuit 2 and the smoothing capacitor 19 and the housing 15 (reference potential conductor). A capacitor 34 (for impedance balance) as a negative electrode-side added capacitance constituting a capacitance Zb between a negative electrode-side parasitic capacitance generation point N and the housing 15 in the embodiment is connected between the negative electrode-side path 17 between the inverter circuit 2 and the smoothing capacitor 19 and the housing 15 (reference potential conductor). Incidentally, although the capacitors 33 and 34 are illustrated apart from the parasitic capacitance generation points P and N in FIG. 1, actually as illustrated in FIG. 3, the capacitor 33 (positive electrode-side added capacitance) is connected between the positive electrode-side parasitic capacitance generation point P (the intersection of collectors of the upper arm switching elements 3 to 5 and the positive electrode-side path 16) and the housing 15, and the capacitor 34 (negative electrode-side added capacitance) is connected between the negative electrode-side parasitic capacitance generation point N (the intersection of emitters of the lower arm switching elements 6 to 8 and the negative electrode-side path 17) and the housing 15 via the shunt resistor 25 in the embodiment. Further, the position of the shunt resistor 25 is also illustrated in FIG. 1 away from the negative electrode-side parasitic capacitance generation point N for the sake of clarity.

Then, the capacitors 33 and 34 and the normal mode coil 30, three-phase common mode coil 28, and ferrite core 29 described above are arranged in the bus bar assembly 12 in the embodiment. Incidentally, the capacitance designated at reference numeral 36 in FIG. 1 indicates a parasitic capacitance (parasitic coupling) between the inverter circuit 2 and the housing 15, and the capacitance designated at reference numeral 37 indicates a parasitic capacitance (parasitic coupling) between the motor M and the housing 15.

(2-3) Inverter Circuit 2

Next, the electric circuit of the inverter circuit 2 and the control board 11 are illustrated in FIG. 2. The inverter circuit 2 has a U-phase inverter 38U, a V-phrase inverter 38V, and a W-phase inverter 38W. The phase inverters 38U to 38W respectively individually have the above-mentioned upper arm side switching elements (referred to as upper arm switching elements) 3 to 5 and the above-mentioned lower arm side switching elements (referred to as lower arm switching elements) 6 to 8. Further, flywheel diodes 39 are respectively connected to the switching elements 3 to 8 in antiparallel.

Then, high potential-side terminals of the upper arm switching elements 3 to 5 of the inverter circuit 2 are connected to the positive electrode-side path 16, and low potential-side terminals of the lower arm switching elements 6 to 8 are connected to the negative electrode-side path 17. The low potential-side terminal of the upper arm switching element 3 of the U-phase inverter 38U and the high potential-side terminal of the lower arm switching element 6 are connected b the intermediate path 31U. This intermediate path 31U is connected to the stator coil of the U phase of the motor M by the output path 32U.

Further, the low potential-side terminal of the upper arm switching element 4 of the V phase inverter 38V and the high potential-side terminal of the lower arm switching element 7 are connected by the intermediate path 31V. This intermediate path 31V is connected to the stator coil of the V phase of the motor M by the output path 32V. In addition, the low potential-side terminal of the upper arm switching element 5 of the W phase inverter 38W and the high potential-side terminal of the lower arm switching element 8 are connected by the intermediate path 31W. This intermediate path 31W is connected to the stator coil of the W phase of the motor M by the output path 32W. Then, the above-mentioned normal mode coil 30, three-phase common mode coil 28, and ferrite core 29 are provided in each of the output paths 32U to 32W located between the intermediate paths 31U to 31W and the motor M. Incidentally, the ferrite cores 29 may be arranged collectively in all phases for the output paths 32U to 32W as indicated by a large square in FIG. 1, or may be arranged respectively separately around the output paths 32U to 32W of each phase as indicated by small squares in FIG. 1.

(2-4) Control Board 11

On the other hand, the control circuit of the control board 11 is comprised of a microcomputer having a processor. In the embodiment, the control circuit inputs a rotation speed command value from an ECU of the vehicle, detects and calculates a phase current of the motor M by using the shunt resistor 25, and controls ON/OFF states of the upper and lower arm switching elements 3 to 8 of the inverter circuit 2, based on these. Specifically, the control circuit controls a gate voltage (drive signal) applied to a gate terminal of each of the upper and lower switching elements 3 to 8, assumes the voltages (phase voltages) of the intermediate paths 31U to 31W respectively connecting the upper and lower arm switching elements 3 to 8 of each phase to be a three-phase AC output, and applies the same to the stator coil of each phase of the motor M via the output paths 32U to 32W to drive the motor M.

(2-5) Bus Bar Assembly 11

Further, the bus bar assembly 12 of the embodiment has a configuration in which a bus bar made of a conductive metal is molded with a hard resin. The filter board 13, the control board 11, the switching elements 3 to 8, and the motor M are connected to the bus bar of the bus bar assembly 12 to form wiring among the battery 14, the control board 11, the switching elements 3 to 8 and the motor M.

(2-6) Parasitic Components (Inductance and Capacitance) of Control Board 11 including Bus Bar Assembly 12

Next, the parasitic components of the control board 11 (including the bus bar assembly 12) of the power conversion device 1 will be described with reference to FIG. 3. In the figure, Zv is the inductance of the positive electrode-side path 16 (wiring) including the bus bar assembly 12, and Zg is the inductance of the negative electrode-side path 17 (wiring) including the bus bar assembly 12. Although there are also other parasitic components in the positive electrode-side path 16 and the negative electrode-side path 17, the inductance of the wiring becomes dominant.

Also, in the figure, Zt is the capacitance between the parasitic capacitance generation point P (FIG. 4) on the positive electrode side including the bus bar assembly 12 and the housing 15 (reference potential conductor), and Zb is the capacitance between the parasitic capacitance generation point N (FIG. 4) on the negative electrode side including the bus bar assembly 12 and the housing 15. The capacitance Zt in the embodiment includes the parasitic capacitance between the parasitic capacitance generation point P on the positive electrode side and the housing 15, and the capacitance of the capacitor 33 (positive electrode-side added capacitance for impedance balance) described above. Further, the capacitance Zb includes the parasitic capacitance between the parasitic capacitance generation point N on the negative electrode side and the housing 15, and the capacitance of the capacitor 34 (negative electrode-side added capacitance for impedance balance) described above.

A portion indicated b a broken line designated at reference numeral 41 in the figure is a noise source comprised of each switching element 3 to 8 (indicated by a switching symbol). Reference numeral 42 is the inductance of the positive electrode-side path 16 branched into each phase (this also means that the inductance becomes dominant). Reference numeral 43 is the inductance of a PCB pattern (this also means that the inductance becomes dominant). Reference numeral 44 is the parasitic capacitance between each of the collectors of the upper arm switching elements 3 to 5 and the housing 15, and reference numeral 46 is the parasitic capacitance between each of the collectors of the lower arm switching elements 6 to 8 and the housing 15 (these also means that the parasitic capacitance becomes dominant). Reference numeral 48 is the parasitic capacitance between each of the emitters of the upper arm switching elements 3 to 5 and the housing 15+the parasitic capacitance between the bus bar and the housing 15 (these also means that the parasitic capacitance becomes dominant). Reference numeral 49 is the parasitic capacitance between each of the emitters of the lower arm switching elements 6 to 8 and the housing 15 (these also means that the parasitic capacitance becomes dominant).

In the figure, Zm indicates an intermediate impedance. The intermediate impedance Zm is the parasitic component among the collectors and emitters of the upper and lower arm switching elements 3 to 8, the bus bar of the bus bar assembly 12, the wiring of the motor M, the intermediate paths 31U to 31W including the parasitic capacitances 37, 44, 46, and 48 and the parasitic inductance 43 (midpoints between the upper arm switching elements 3 to 5 and the lower arm switching elements 6 to 8), and the housing 15. A common mode current flows out to the housing 15 through the intermediate impedance Zm and hence common mode noise is generated.

Incidentally, although the above-mentioned intermediate added impedance Zm1 is not illustrated in FIG. 3, in the present invention, as illustrated in the embodiment of FIG. 1, the intermediate added impedance Zm1 comprised of the normal mode coil 30, the three-phase common mode coil 28, and the ferrite core 29 is additionally connected to the output paths 32U to 32W between the intermediate paths 31U to 31W and the motor M and correspondingly, the value of the intermediate impedance Zm is increased.

(3) Reduction in Noise by Establishing Impedance Balance Condition (Equilibrium Condition)

Figure 4:
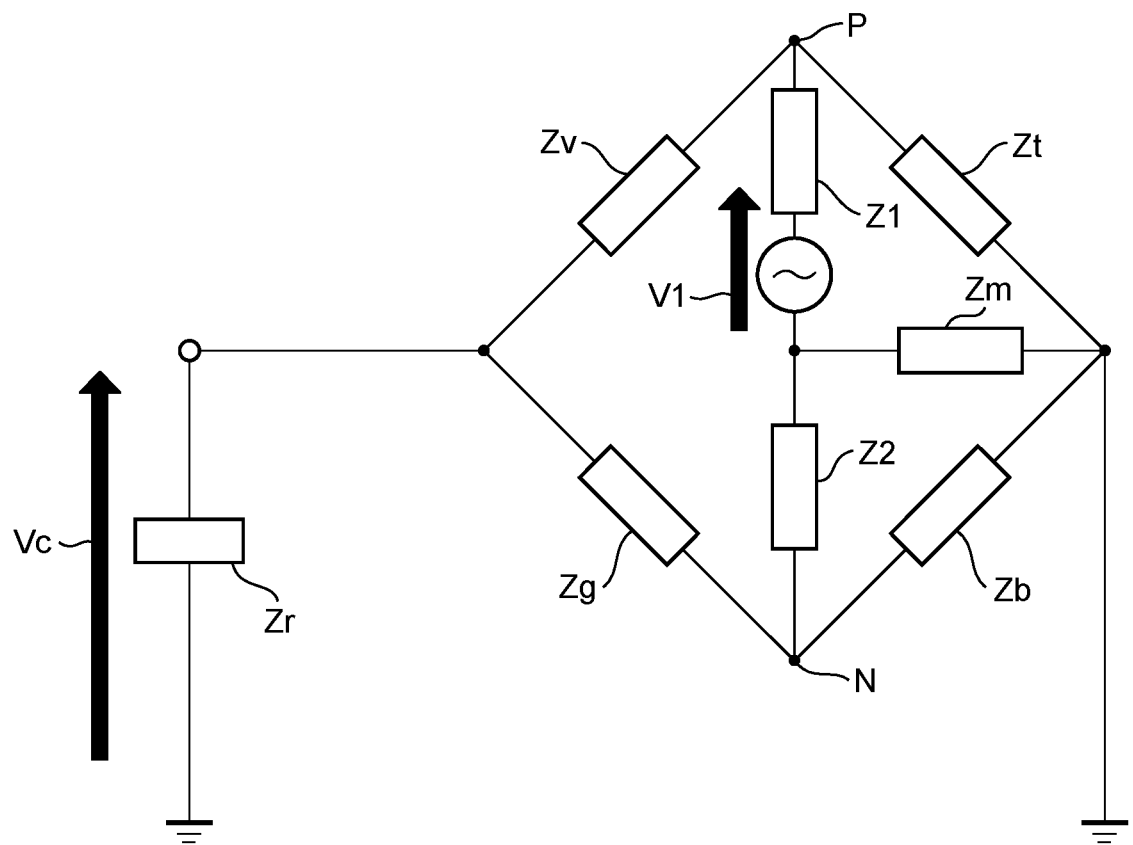
FIG. 4 is a diagram illustrating a modeled bridge circuit of the power conversion device of FIG. 1.

Next, a noise reduction measure by establishing an impedance balance condition (equilibrium condition) will be described with reference to FIG. 4. A bridge circuit of FIG. 4 is, for example, a common mode equivalent circuit (modeled bridge circuit) when the U-phase inverter 38U in FIG. 2 becomes a noise source V1 (when the upper arm switching element 3 becomes a noise source). In the figure, Zv is the inductance of the positive electrode-side path 16 described above, Zg is the inductance of the negative electrode-side path 17, Zt is the capacitance between the parasitic capacitance generation point P on the positive electrode side including the capacitance of the capacitor 33 and the housing 15 (reference potential conductor), Zb is the capacitance between the parasitic capacitance generation point N on the negative electrode side including the capacitance of the capacitor 34 and the housing 15, and Zm is the intermediate impedance including the intermediate added impedance Zm1. When the lower arm switching element 6 becomes a noise source, the noise source is located below the intersection with the intermediate impedance Zm.

Incidentally, in the case of FIG. 4, the positive electrode-side parasitic capacitance generation point. Pin the present invention is the intersection of the collector of the upper arm switching element 3 and the positive electrode-side path 16, and the negative electrode-side parasitic capacitance generation point N is the intersection of the emitter of the lower arm switching element 6 and the negative electrode-side path 17. Further, in the case of FIG. 4. the inductance Zv of the positive electrode-side path 16 in the present invention is the inductance of the positive electrode-side path 16 up to the intersection with the collector of the upper arm switching element 3, and the inductance Zg of the negative electrode-side path 17 is the inductance of the negative electrode-side path 17 up to the intersection with the emitter of the lower arm switching element 6. When the V-phase inverter 38V becomes the noise source V1, likewise, the intersection of the collector of the upper arm switching element 4 and the positive electrode-side path 16 becomes the positive electrode-side parasitic capacitance generation point P, and the intersection of the emitter of the lower arm switching element 7 and the negative electrode-side path 17 becomes the negative electrode-side parasitic capacitance generation point N. In that case, the inductance of the positive electrode-side path 16 up to the intersection with the collector of the upper arm switching element 4 becomes Zv, and the inductance of the negative electrode-side path 17 up to the intersection with the emitter of the lower arm switching element 7 becomes Zg. Further, when the W-phase inverter 38W becomes the noise source V1, the intersection of the collector of the upper arm switching element 5 and the positive electrode-side path 16 becomes the positive electrode-side parasitic capacitance generation point P, and the intersection of the emitter of the lower arm switching element 8 and the negative electrode-side path 17 becomes the negative electrode-side parasitic capacitance generation point N. In that case, the inductance of the positive electrode-side path 16 up to the intersection with the collector of the upper arm switching element 5 becomes Zv, and the inductance of the negative eiectrode-side path 17 up to the intersection with the emitter of the lower arm switching element 8 becomes Zg.

Further, Z1 in FIG. 4 represents the internal impedance+inductance 42 of the upper arm of the noise source V1 (FIG. 3), and Z2 represents the internal impedance+inductance 42 of the lower arm of the noise source V1. Since the inductance 42 is small and the position of connection between the capacitor 33 and the parasitic capacitance 44 is substantially the same, the parasitic capacitance 44 is not Z1 but the capacitance Zt. In addition, Zr represents a common mode impedance from the intersection of the inductance Zv and the inductance Zg (starting point on the left side facing the bride circuit in FIG. 4) to the housing 15. The intersection of the inductance Zv and the inductance Zg in FIG. 4 is a starting point on the battery 14 (power supply) side and is a high frequency short circuit point.

Then, in FIG. 4, Vc is a common mode voltage generated on the LISN side which is a noise measurement point. Due to the common mode voltage Vc generated by a switching operation inside the circuit, a common mode current flows through connected wiring, and noise is generated. By establishing an equilibrium condition (impedance balance condition) which makes the common mode voltage Vc zero or extremely small, it is possible to eliminate or significantly reduce the noise due to the common mode current which flows out due to the switching operation.

Calculating from this circuit equation, the common mode voltage Vc can be expressed by the following formula (I).

[Math. 1]

$$V_C = \frac{(Z_g Z_t - Z_b Z_v)\frac{Z_t}{Z_m}(Z_b Z_g + Z_2 Z_g + Z_2 Z_b)}{Z_A + \frac{Z_t}{Z_m} Z_B} V_1, \quad (I)$$

$$Z_A = (Z_t + Z_b)(Z_v + Z_g) + Z_2(Z_t + Z_b + Z_v + Z_g),$$

$$Z_B = (Z_2 + Z_b)(Z_v + Z_g) + Z_2 Z_b,$$

Incidentally, the impedance Z1 is in an ON state of the upper arm switching element 3 and is ignored because its value is lower than the values of other elements.

Further, when Zm is sufficiently large, the numerator second term and the denominator second term of the formula (I) can be ignored, and the formula (I) can be written by the following formula (II).

[Math. 2]

$$V_C = \frac{(Z_g Z_t - Z_b Z_v)}{(Z_t + Z_b)(Z_v + Z_g) + Z_2(Z_t + Z_b + Z_v + Z_g)} V_1, \quad (II)$$

Here, the condition to make the numerator ($Z_g Z_t - Z_b Z_v$) of the formula (II) zero, that is, the impedance balance condition becomes the following formula (III).

$$Z_g \cdot Z_t = Z_b \cdot Z_v \quad (III)$$

Therefore, in this embodiment, the power conversion device 1 is designed so that the capacitances of the capacitors 33 and 34 to be connected in order to take the impedance balance illustrated in FIG. 1 are selected to adjust the capacitance Zt between the positive electrode-side parasitic capacitance generation point P and the housing 15 (reference potential conductor) and the capacitance Zb between the negative electrode-side parasitic capacitance generation point N and the housing 15, thereby establishing or substantially establishing the above formula (III). It should be noted that the term "substantially established" does not mean Zg·Zt=Zb·Zv, but means that it is nearly equal (within a certain allowable range A in which the difference between the two is extremely small). It is thus possible to effectively reduce noise.

Specifically, for example, if a 900 pF capacitor 33 (positive electrode-side added capacitance) is connected as the component of the capacitance Zt, and a 1000 pF capacitor 34 (negative electrode-side added capacitance) is connected as the component of the capacitance Zb when the ratio of the inductance Zv to the inductance Zg is 1:1 and the original parasitic capacitance between the positive electrode-side parasitic capacitance generation point P and the housing 15 is 100 pF, the ratio of the capacitance Zt to the capacitance Zb also becomes 1:1 and the impedance balance condition is met.

Alternatively, even if such a value that the original parasitic capacitance of 100 pF can be ignored, for example, a capacitor 33 (positive electrode-side added capacitance) and a capacitor 34 (negative electrode-side added capacitance) of 10 nF are connected, the ratio of the capacitance Zt to the capacitance Zb becomes approximately 1:1, so that the impedance balance condition is satisfied.

In particular, in the present invention, since the intermediate added impedance Zm1 (normal mode coil 30, three-phase common mode coil 28, and ferrite core 29) is connected between the intermediate paths 31U to 31W and the motor M, the impedance of the path passing through the parasitic capacitance 37 becomes sufficiently large even though a drive target is a three-phase motor M. Thus when the impedance balance (equilibrium) is taken, the values involving the intermediate impedance Zm, that is, the numerator second term and the denominator second term of the formula (I) become negligibly small, so that it becomes easy to take the equilibrium of the bridge circuit (get it balanced) by the capacitance Zt between the positive electrode-side parasitic capacitance generation point P and the housing 15 (reference potential conductor) and the capacitance Zb between the negative electrode-side parasitic capacitance generation point N and the housing 15 (the selection of the capacitances of the capacitors 33 and 34 in the embodiment), and it becomes possible to easily and effectively reduce noise.

Further, as in the embodiment, the intermediate added impedance Zm1 (normal mode coil 30, three-phase common mode coil 28, and ferrite core 29) is additionally connected between the intermediate paths 31U to 31W and the motor M. Therefore, the impedance of the path passing through the parasitic capacitance 37 increases, and hence the common mode current flowing out from this path can be reduced. Consequently, even when the parasitic capacitance 37 between the motor M and the housing 15 is large, the effect of the impedance balance can be enhanced, and noise can be further suppressed without mounting a large EMI filter.

In addition, in the embodiment, the intermediate added impedance Zm1 is comprised of the normal mode coil 30, the three-phase common mode coil 28, and the ferrite core 29. Providing the three-phase common mode coil 28 and the ferrite core 29 as the intermediate added impedance Zm1 in this way makes it possible to increase the common mode impedance and reduce the outflow of the common mode current. On the other hand, due to the provision of the normal mode coil 30 as the intermediate added impedance Zm1, it is possible to effectively suppress a switching surge. As a result, since the mode conversion between the three-phase lines (from the normal mode to the common mode) is suppressed, these make it possible to be less susceptible to the parasitic capacitance 37 between the motor M and the housing 15.

Moreover, unlike the common mode coil, the normal mode coil 30 does not require the coupling of three-phase lines, so that it can be arranged separately. Even when it is arranged in the bus bar assembly 12 as in the embodiment, there are fewer restrictions on the arrangement, and it is easier to be miniaturized than in the case of the common mode coil. Incidentally, the normal mode coil 30 may not be inserted in all of the output paths 32U to 32W (three phases)

as in the embodiment, but may be inserted in only two phases, for example. This also has the advantage of being easy to use because a noise reduction effect can be obtained.

Further, the inconvenience that the normal mode current flows out into the housing 15 as the common mode current can be suppressed by providing the EMI filter 18 with the normal mode coils 22 and 35 connected to the positive electrode-side path 16 and the negative electrode-side path 17 respectively as in the embodiment. In particular, by connecting the normal mode coils 22 and 35 to both the positive electrode-side path 16 and the negative electrode-side path 17, the impedances on the positive electrode side and the negative electrode side can be made equal, and the degree of equilibrium can be maintained, thus making it possible to bring out the effect of the impedance balance to the maximum.

Incidentally, in the embodiment, the equilibrium degree can be maintained even when the normal mode coil is not connected to both the positive electrode-side path 16 and the negative electrode-side path 17, but in that case, it is not possible to suppress the inconvenience that the normal mode current flows out as the common mode current.

(4) Noise Reduction Effect

Figure 5:
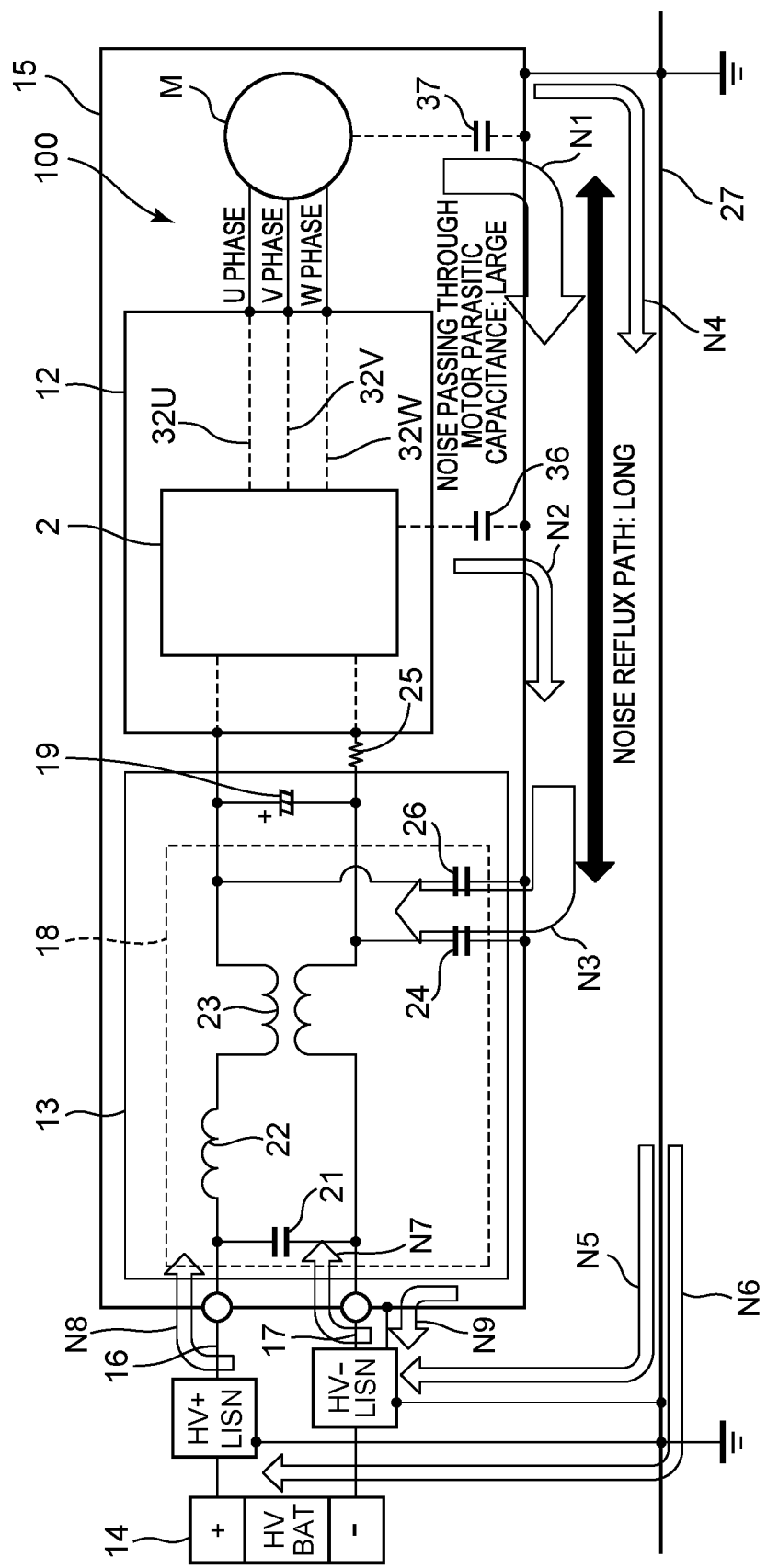
FIG. 5 is a diagram describing a noise path of a conventional power conversion device.

Next, the noise reduction effect according to the present invention will be described with reference to FIGS. 5 and 6. FIG. 5 illustrates an electric circuit diagram of a power conversion device 100 which is not provided with the above-mentioned normal mode coil 30, three-phase common mode coil 28, ferrite core 29, and capacitors 33 and 34. Incidentally, in this figure, those designated by the same reference numerals as those in FIG. 1 are assumed to have the same or similar functions.

In this figure, an arrow indicated by N1 indicates the common mode current (noise) flowing out from the motor M to the housing 15 via the parasitic capacitance 37, an arrow indicated by N2 indicates the common mode current (noise) flowing out from the inverter circuit 2 to the housing 15 via the parasitic capacitor 36, an arrow indicated by N3 indicates the common mode current (noise) flowing back from the housing 15 to the upper and lower arm switching elements 3 to 8 of the inverter circuit 2 via the Y capacitors 24 and 26, and an arrow indicated by N9 indicates the common mode current (noise) flowing into the LISNs 16 and 17 on the positive electrode side (+) and the negative electrode side (−) through a shielded wire of an connector attached to the housing 15. respectively. Further, an arrow indicated by N4 indicates the common mode current (noise) flowing out from the housing 15 to the vehicle body 27, and arrows indicated by N5 to N8 indicate the common mode current (noise) flowing from the vehicle body 27 to the EMI filter 18 via the LISN 17 and the LISN 16. Incidentally, although the arrows in the figure are illustrated in only one direction, the flow of the common mode current is not simple in reality, and the common mode current flows in and out in both directions at each location.

In the case of the power conversion device 100 of FIG. 5, the common mode current (N1) flowing out from the motor M via the parasitic capacitance 37 becomes large. Further, the common mode current and the common mode current (N2) flowing out from the inverter circuit 2 to the housing 15 flow back to the upper and lower arm switching elements 3 to 8 of the inverter circuit 2 which is a noise source via the V capacitors 24 and 26 (N3). However, since the Y capacitors 24 and 26 are separated from the motor M and the inverter circuit 2, a reflux path becomes long, and the filter effect of the Y capacitors 24 and 26 (the effect of recirculating the common mode current) is not sufficiently obtained.

Figure 6:
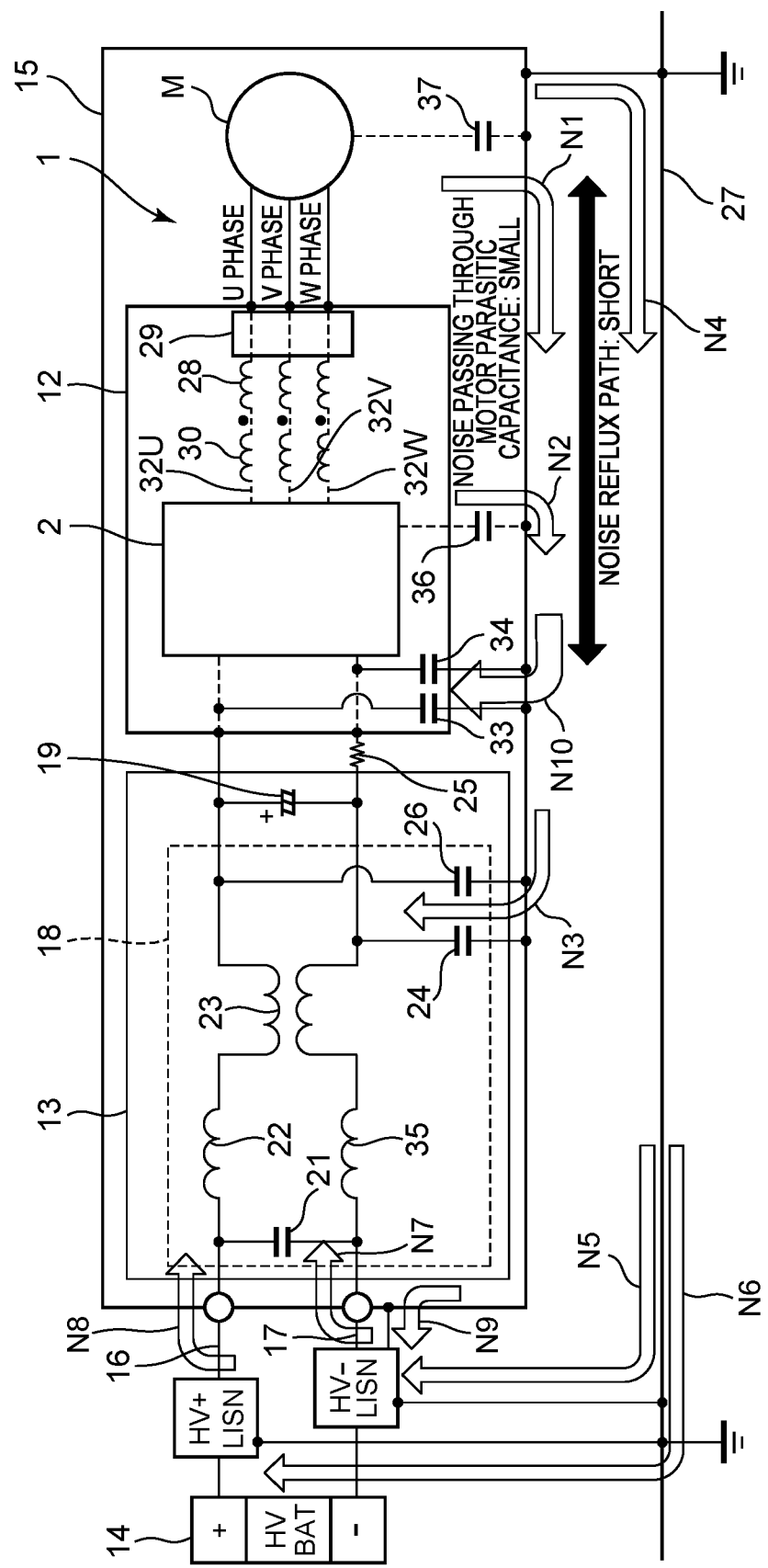
FIG. 6 is an electric circuit diagram for describing a noise path of the power conversion device of FIG. 1.

On the other hand, in the embodiment, as illustrated in FIGS. 1 and 6, the capacitors 33 and 34 are connected to balance the impedance, and the common mode voltage Vc is set to be zero or extremely small. Therefore, it is possible to suppress the common mode current (N1) and eliminate or significantly reduce noise.

In particular, in the present invention, since the intermediate added impedance Zm1 (normal mode coil 30, three-phase common mode coil 28, and ferrite core 29) is connected between the intermediate paths 31U to 31W and the motor M, the impedance of the path passing through the parasitic capacitance 37 becomes sufficiently large. Consequently, when the impedance balance (equilibrium) is taken, the values related to the intermediate impedance Zm (the numerator second term and the denominator second term of the formula (I)) become so small that they can be ignored. Therefore, it becomes easier to adjust the capacitance Zt between the positive electrode-side parasitic capacitance generation point P and the housing 15 (reference potential conductor) and the capacitance Zb between the negative electrode-side parasitic capacitance generation point N and the housing 15, that is, to take the equilibrium (balance) of the bridge circuit by the selection of the capacitances of the capacitors 33 and 34 in the embodiment, thus making it possible to easily and effectively reduce noise.

Further, with the capacitors 33 and 34 being arranged in the bus bar assembly 12 as illustrated in FIGS. 1 and 6, most of the common mode current (N1) flowing out from the motor M via the parasitic capacitance 37 and the common mode current (N2) flowing out from the inverter circuit 2 to the housing 15 flow back to the upper and lower arm switching elements 3 to 8 of the inverter circuit 2 which is a noise source via the capacitors 33 and 34, as indicated by an arrow N10 in FIG. 6.

Since the bus bar assembly 12 is provided at a position closer to the motor M and the upper and lower arm switching elements 3 to 8 of the inverter circuit 2 than the filter board 13, the reflux path becomes short by arranging these capacitors 33 and 34 in the bus bar assembly 12, and hence a high filter effect can be obtained in the capacitors 33 and 34. Consequently, it is possible to suppress noise without inserting a large common mode coil into a power supply input unit as in the conventional case, and it is possible to effectively suppress noise while realizing miniaturization.

Further, in the embodiment, since the normal mode coil 30, the three-phase common mode coil 28, and the ferrite core 29 are arranged in the bus bar assembly 12 between the upper and lower arm switching elements 3 to 8 of the inverter circuit 2 and the motor M, the impedance of the path passing through the parasitic capacitance 37 increases, and the common mode current (noise and indicated by the arrow N1) flowing out via the parasitic capacitance 37 becomes small. This also eliminates the need to insert a large common mode coil into a power supply input unit, and it is possible to effectively suppress noise while miniaturizing an inverter-integrated electric compressor 1.

Incidentally, in the embodiment, the capacitor 33 is connected between the positive electrode-side path 16 and the housing 15 as the positive electrode-side added capacitance, and the capacitor 34 is also connected between the negative electrode-side path 17 and the housing 15 as the negative electrode-side added capacitance to thereby adjust the capacitance Zt between the positive electrode-side parasitic capacitance generation point P and the housing 15 (reference potential conductor) and the capacitance Zb between the negative electrode-side parasitic capacitance generation point N and the housing 15 to balance the impedance. However, only either one of the capacitors 33 and 34 may be connected, and the capacitance of the other (Zb or Zt) may be dealt with by adjusting the parasitic capacitance between the parasitic capacitance generation point P or N and the housing 15.

Specifically, for example, when the ratio of the inductance Zv to the inductance Zg is 1:1 and the original parasitic capacitance between the positive electrode-side parasitic capacitance generation point P and the housing 15 is 100 pF, this is regarded as the capacitance Zt. Then, if only a 100 pF capacitor 34 (negative electrode-side added capacitance) is newly connected as the component of the capacitance Zb, the ratio of the capacitance Zt to the capacitance Zb becomes 1:1, and the impedance balance condition is satisfied.

Further, in an embodiment of the invention, both the capacitance Zt between the positive electrode-side parasitic capacitance generation point P and the housing 15 and the capacitance Zb between the negative electrode-side parasitic capacitance generation point N and the housing 15 may be dealt with only by adjusting the parasitic capacitance without connecting the capacitor 33 (positive electrode-side added capacitance) and the capacitor 34 (negative electrode-side added capacitance) to thereby achieve the impedance balance. In these cases, the parasitic capacitance can be adjusted, for example, by changing the distance between a heat sink and a heat radiation sheet to radiate heat from each of the switching elements 3 to 8, or selecting the switching elements different in terms of the parasitic coupling between the collector and the heat sink and the parasitic coupling between the emitter and the heat sink.

Changing the distance between the heat sink and the heat radiation sheet results in the adjustment of the parasitic capacitance, and the value of the parasitic capacitance 44 in FIG. 3 changes, so that the capacitance Zt is changed (adjusted). The switching element itself can be changed (adjusted) by the value of the internal impedance+parasitic capacitance and the position thereof. If the internal impedance changes, Z1 and Z2 in FIG. 4 change, but since Z1 and Z2 are not dominant factors in the impedance balance, only the parasitic capacitance 44 changes.

Also, in the embodiment, the bus bar assembly 12 in which the bus bar is molded with the hard resin is adopted as the wiring member, but in an embodiment of the invention, the bus bar may not be molded with the resin. Further, in the embodiment, the normal mode coil 30, the three-phase common mode coil 28, and the ferrite core 29 are connected as the intermediate added impedance Zm1, but the present invention is not limited to this, and only either one of them or two combinations (a combination of the normal mode coil 30 and the three-phase common mode coil 28, or a combination of the normal mode coil 30 and the ferrite core 29, or a combination of the three-phase common mode coil 28 and the ferrite core 29) of them may be connected to be formed as the intermediate added impedance Zm1.

Further, in the embodiment, the normal mode coils 22 and 35 are connected to both the positive electrode-side path 16 and the negative electrode-side path 17, but in an embodiment of the invention, the normal mode coil (22 or 35) may be connected to only either one of the positive electrode-side path 16 and the negative electrode-side path 17.

In addition, although the example in which the motor M of the electric compressor is driven by the power conversion device 1 illustrated in the embodiment has been described, the present invention is not limited thereto, and it is needless to say that the present invention is effective for various devices which drive a three-phase motor.

DESCRIPTION OF REFERENCE NUMERALS

1 power conversion device
2 inverter circuit
3 to 8 upper and lower arm switching element
11 control board
12 bus bar assembly (wiring member)
14 battery (DC power supply)
15 housing (reference potential conductor)
16 positive electrode-side path
17 negative electrode-side path
22, 35 normal mode coil
28 three-phase common mode coil (Zm1)
29 ferrite core (Zm1)
30 normal mode coil (Zm1)
31U to 31W intermediate path
32U to 32W output path
33 capacitor (positive electrode-side added capacitance)
34 capacitor (negative electrode-side added capacitance)
M motor
N negative electrode-side parasitic capacitance generation point
P positive electrode-side parasitic capacitance generation point
Zb capacitance between negative electrode-side parasitic capacitance generation point N and housing 15
Zg inductance of negative electrode-side path
Zm intermediate impedance
Zm1 intermediate added impedance
Zt capacitance between positive electrode-side parasitic capacitance generation point P and housing 15
Zv inductance of positive electrode-side path

The invention claimed is:

1. A power conversion device including an upper arm switching element and a lower arm switching element of each phase and applying a three-phase AC output to a motor, comprising:

a positive electrode-side path to connect a positive electrode side of a DC power supply and a high potential-side terminal of the upper arm switching element;

a negative electrode-side path to connect a negative electrode side of the DC power supply and a low potential-side terminal of the lower arm switching element; and an intermediate path to connect a low potential-side terminal of the upper arm switching element and a high potential-side terminal of the lower arm switching element; and paths to connect the positive electrode-side path and the negative electrode-side path to a reference potential conductor via added capacitances;

wherein the inductance of the positive electrode-side path is Zv, the inductance of the negative electrode-side path is Zg, the capacitance between a positive electrode-side parasitic capacitance generation point P and the reference potential conductor is Zt, and the capacitance between a negative electrode-side parasitic capacitance generation point N and the reference potential conductor is Zb, the capacitance Zt between the positive electrode-side parasitic capacitance generation point P and the reference potential conductor and the capacitance Zb between the negative electrode-side parasitic capacitance generation point N and the reference potential conductor are set so that an impedance balance condition of a bridge circuit constituted by the inductance Zv of the positive electrode-side path, the inductance Zg of the negative electrode-side path, the capacitance Zt between the positive electrode-side parasitic capacitance generation point P and the reference potential conductor, and the capacitance Zb between the negative electrode-side parasitic capacitance generation point N and the reference potential conductor is established to reduce a noise due to a common mode current, and wherein an intermediate added impedance Zml is connected between the intermediate path and the motor.

2. The power conversion device according to claim 1, wherein the relationship of Zg·Zt=Zb·Zv is established, or the relationship of Zg·Zt=Zb·Zv is substantially established.

3. The power conversion device according to claim 1, including a positive electrode-side added capacitance connected between the positive electrode-side parasitic capacitance generation point P and the reference potential conductor and a negative electrode-side added capacitance connected between the negative electrode-side parasitic capacitance generation point N and the reference potential conductor.

4. The power conversion device according to claim 1, wherein the intermediate added impedance Zml is comprised of any of a normal mode coil, a three-phase common mode coil, and a ferrite core, or a combination of two of them, or all of them.

5. The power conversion device according to claim 1, including:
a control board to control switching of the upper and lower arm switching elements, and
a wiring member provided to wire among the DC power supply, the control board, the upper and lower arm switching elements, and the motor,
wherein the intermediate added impedance Zml is arranged in the wiring member.

6. The power conversion device according to claim 5, including either one or both of a positive electrode-side added capacitance connected between the positive electrode-side parasitic capacitance generation point P and the reference potential conductor and a negative electrode-side added capacitance connected between the negative electrode-side parasitic capacitance generation point N and the reference potential conductor,
wherein the positive electrode-side added capacitance and/or the negative electrode-side added capacitance is arranged in the wiring member.

7. The power conversion device according to claim 5, wherein the wiring member is a bus bar assembly formed by molding a bus bar with a resin.

8. The power conversion device according to claim 1, including an EMI filter connected between the DC power supply and the upper and lower arm switching elements,
wherein the EMI filter includes normal mode coils connected to both the positive electrode-side path and the negative electrode-side path respectively.

9. The power conversion device according to claim 2, including a positive electrode-side added capacitance connected between the positive electrode-side parasitic capacitance generation point P and the reference potential conductor and a negative electrode-side added capacitance connected between the negative electrode-side parasitic capacitance generation point N and the reference potential conductor.

10. The power conversion device according to claim 2, wherein the intermediate added impedance Zml is comprised of any of a normal mode coil, a three-phase common mode coil, and a ferrite core, or a combination of two of them, or all of them.

11. The power conversion device according to claim 3, wherein the intermediate added impedance Zml is comprised of any of a normal mode coil, a three-phase common mode coil, and a ferrite core, or a combination of two of them, or all of them.

12. The power conversion device according to claim 6, wherein the wiring member is a bus bar assembly formed by molding a bus bar with a resin.

13. The power conversion device according to claim 2, including an EMI filter connected between the DC power supply and the upper and lower arm switching elements,
wherein the EMI filter includes normal mode coils connected to both the positive electrode-side path and the negative electrode-side path respectively.

14. The power conversion device according to claim 3, including an EMI filter connected between the DC power supply and the upper and lower arm switching elements,
wherein the EMI filter includes normal mode coils connected to both the positive electrode-side path and the negative electrode-side path respectively.

15. The power conversion device according to claim 4, including an EMI filter connected between the DC power supply and the upper and lower arm switching elements,
wherein the EMI filter includes normal mode coils connected to both the positive electrode-side path and the negative electrode-side path respectively.

16. The power conversion device according to claim 5, including an EMI filter connected between the DC power supply and the upper and lower arm switching elements,
wherein the EMI filter includes normal mode coils connected to both the positive electrode-side path and the negative electrode-side path respectively.

17. The power conversion device according to claim 6, including an EMI filter connected between the DC power supply and the upper and lower arm switching elements,
wherein the EMI filter includes normal mode coils connected to both the positive electrode-side path and the negative electrode-side path respectively.

18. The power conversion device according to claim 7, including an EMI filter connected between the DC power supply and the upper and lower arm switching elements,
wherein the EMI filter includes normal mode coils connected to both the positive electrode-side path and the negative electrode-side path respectively.

* * * * *